United States Patent [19]

Chen et al.

[11] 4,085,451

[45] Apr. 18, 1978

[54] BUBBLE DOMAIN CIRCUIT ORGANIZATION

[75] Inventors: Thomas T. Chen; Isoris S. Gergis, both of Yorba Linda, Calif.

[73] Assignee: Rockwell International Corporation, El Segundo, Calif.

[21] Appl. No.: 806,420

[22] Filed: Jun. 14, 1977

[51] Int. Cl.² ............................................. G11C 19/08
[52] U.S. Cl. ............................................. 365/4; 365/7; 365/12; 365/14; 365/43
[58] Field of Search ................................. 340/174 TF

[56] References Cited

U.S. PATENT DOCUMENTS 4,032,905  6/1977  Chen .......................... 340/174 TF

OTHER PUBLICATIONS

IEEE Transactions On Magnetics — vol. Mag–12, No. 6, Nov. 1976, pp. 630–632.

Primary Examiner—James W. Moffitt
Attorney, Agent, or Firm—H. Fredrick Hamann; G. Donald Weber, Jr.

[57] ABSTRACT

An on-chip bubble domain circuit organization utilizing a multi-chip concept is provided. One or more storage registers are separately connected to each of a plurality of propagation channels whereby data in the form of magnetic bubble domains (bubbles) may be transferred into and out of the storage registers. Each of the propagation channels includes a generator for producing the initial bubbles which are supplied to a multiple output replicator via an input propagation path. The initial bubbles are replicated into any desired number of new bubbles by a multiple output replicator. The input propagation paths for the several channels have different lengths of propagation times between the generator and the replicator. Input decoders are utilized to determine to which storage register the bubbles from the replicators will be directed along the propagation channel. Those bubbles not selected are, typically, annihilated.

Output decoders utilizing essentially the same decoding scheme as the input decoders, selectively received bubbles from the storage registers. A transfer and replicate switch is utilized between the storage register and output decoders to selectively transfer bubbles to the output decoders. The output decoders may collapse all of the bubbles from certain storage registers so that only the information from the selected storage register reaches the detector. Moreover, the output decoders have different path lengths to the detectors, as a function of the input propagation path, so that each channel has the same propagation time from generator to detector. The detectors in turn produce the chip output signals. External control electronics are utilized to control the selective operation of the various devices utilized in the propagation channels.

6 Claims, 6 Drawing Figures $A, B = 4, 8$
$A, \bar{B} = 3, 7$
$\bar{A}, B = 2, 6$
$\bar{A}, \bar{B} = 1, 5$

BUBBLE DOMAIN CIRCUIT ORGANIZATION

BACKGROUND OF THE INVENTION

1. Field of the Invention

This invention relates to a magnetic bubble domain chip and more particularly to a chip organization utilizing a unique annihilator-type input/output decoder as well as a unique arrangement of components to permit alternate bit operation.

2. Description of the Prior Art

In the prior art, bubble domains are produced by suitable generators. Typically, in a information storage application, each storage register is associated with a separate generator. Conventional bubble generators, such as current loop generators, require relatively large currents to nucleate bubbles. Therefore, it is highly desirable to reduce the number of generators in a bubble domain chip organization.

The on-chip decoding organization approach has been found to enjoy an advantage of faster access time over other systems such as the serial or major-minor loop organization. The slower access time of known systems is normally attributed to designs that require all blocks of information to be arranged in series, thus, requiring the blocks to be rotated, in sequence, to the input/output port. The known systems generally also require read data to be recycled back into the minor loops which lengthens and further complicates the read operation.

In known decoder organizations, all blocks of information are arranged in parallel whereby longer access time and discontinuous data readout can be substantially overcome. However, in the past, the requirement of decoder lines including switches and passive annihilators in the chip designs have been plagued with small margin overlap of the decoder switches and other circuit components. This problem substantially reduces the effectiveness of the existing decoder organization schemes. In addition, the prior art chip organizations require a large number of decoder components and the attendant large driving power. Moreover, these decoder components require separate control leads which makes the chip organization very complicated.

With respect to prior art chip organizations, reference is made to G. S. Almasi et al., "Fabrication and Operation of a Self-Contained Bubble Memory Chip", AIP Conference Proc., No. 5, pp. 220–224, 1972; H. Chang et al., "Self-Contained Magnetic Bubble Domain Memory Chip", IEEE Transactions Magnetics, Vol. MAG-8, No. 2, pp. 214–222, 1972; Chang et al., U.S. Pat. No. 3,701,125 or Chang et al., U.S. Pat. No. 3,689,902.

Reference is also made to the copending U.S. patent application bearing Ser. No. 614,401 entitled BUBBLE DOMAIN CIRCUIT ORGANIZATION by T. T. Chen, filed Sept. 18, 1975 and now U.S. Pat. No. 4,032,905, and Ser. No. 633,306 entitled CONSECUTIVE BIT ACCESS OF MAGNETIC BUBBLE DOMAIN MEMORY DEVICES by I. S. Gergis, filed Nov. 19, 1975, each of which is assigned to the common assignee.

The Ser. No. 614,401 application (Chen) teaches an on-chip bubble domain circuit organization having a unique multiple output replicator and decoder arrangement. This arrangement permits operates in a dual phase and double polarity mode, (i.e. positive and negative pulses at different phasing). This arrangement requires relatively tight control on operating conditions such as pulse amplitude and phasing. Modification to the decoder arrangement permit wider operaging margins but require more decoder stages and, thus, decoder lines, with the attendant problems of complexity.

The Ser. No. 633,306 application (Gergis) teaches a dual channel concept with alternate bit propagation in the input/output sections but not in the storage areas. This latter arrangement provides wider operating margins for the chip organizaton.

SUMMARY OF THE INVENTION

This invention describes a unique bubble memory chip organization which combines the advantages of the serial type organization such as major-minor chip and parallel type organization such as the on-chip decoder chip. The device access time is much faster than the convertial major-minor chip and the chip control 13 is simpler than the decoder chip.

The chip organization is a multiplexed decoder organizaton with many identical channels operated in parallel. Each channel is a separate decoder organization. The channels are identical to each other except that the generator and detector distances are separately adjusted. With a unique data distribution among these channels, all the channels can be operated in parallel and, thus, the whole chip function is equivalent to a single chip with one set of generator, detector and access controls. By subdividing the chip into channels, the number of decoder leads can be greatly reduced, thereby simplifying the complexity of the chip and also the control electronics while the access time may still be maintained close to the convertial decoder chip organization.

This invention relates to a magnetic bubble domain chip organization having a plurality of propagation channels and using an improved decoder scheme. In this organization, an output bubble is produced for a periodically controlled number of cycles. Specific circuit organization permits alternate bit propagation therein.

A multiple output replicator in the chip organization replicates the bubbles from the generator into prescribed numbers of new bubble domains. However, in different propagation channels different propagation times are provided between the generator and the multiple output replicator. Thus, bubbles are supplied to the replicators at the same time even though the generators are operated at different times.

Before the new bubbles from the replicators reach the respective storage registers, they are decoded by an input decoder which destroys all bubbles except the selected stream. This proposed design assures that the propagation paths will be free of unwanted bubbles to interfere with the chip operation.

For reading purposes, an output decoder similar to the input decoder is utilized. All bubbles emanating from the respective storage registers are annihilated except those selected. Only the information from the selected storage loop reaches the multiple input detector for sensing purposes. Again, different propagation times are provided from the storage registers to the detectors for the different channels. The different propagation times at the input and output ends of the channels are related so that all channels have the same propagation time.

DETAILED DESCRIPTION OF THE PREFERRED EMBODIMENT

Figure 1:
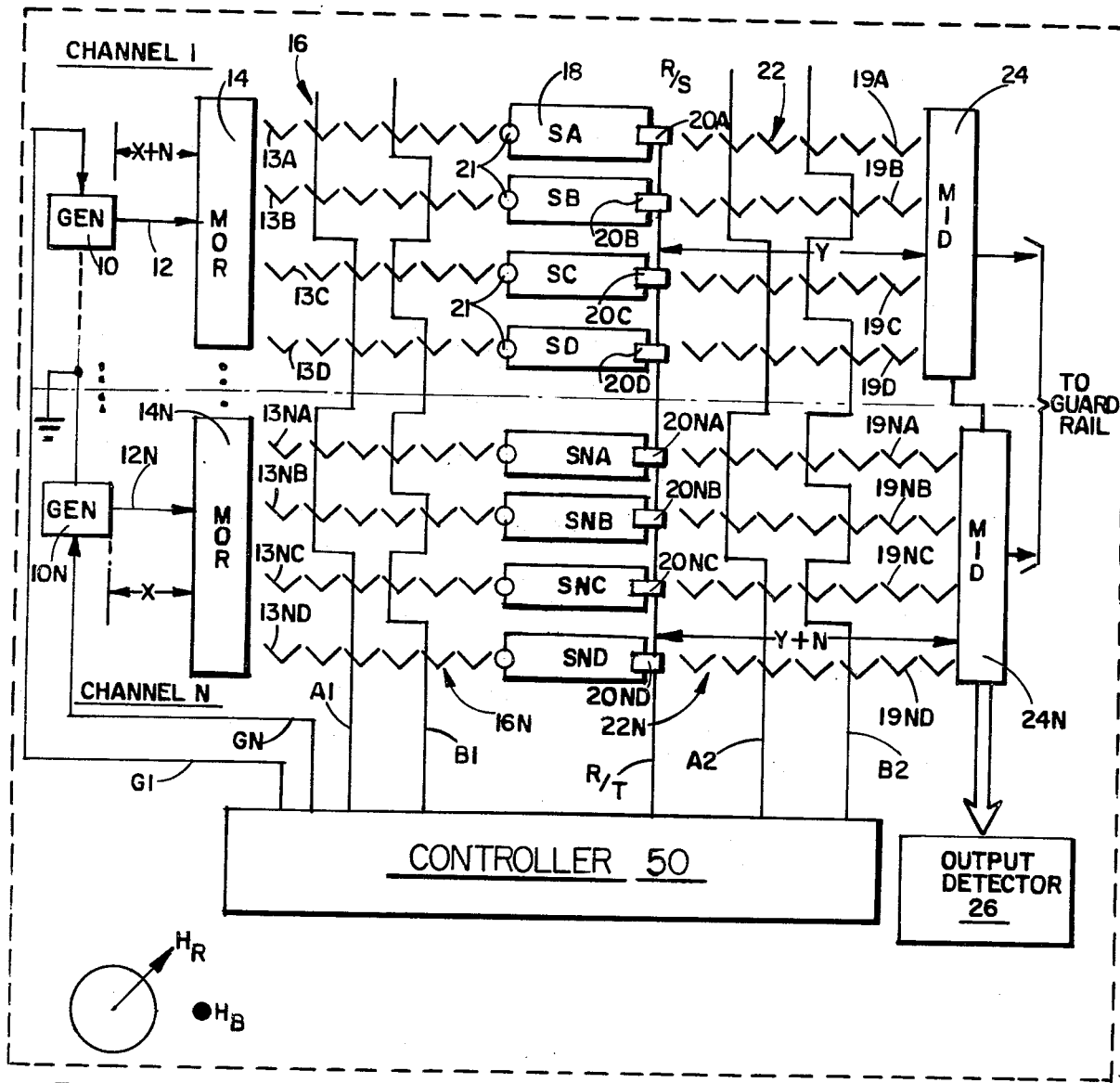
FIG. 1 is a block diagram of the chip organization contemplated by this invention.

Referring to FIG. 1, there is shown, schematically, an illustrative multiple channel magnetic bubble domain chip organization which provides writing, storing, decoding, clearing and sensing. Chip organization components are formed on magnetic sheet 100 which is fabricated of material suitable for forming bubble domains, such as garnet or othroferrite. A bias field, $H_B$ is applied normal to the plane of the magnetic sheet to produce magnetic bubble domains in sheet 100. In addition, a cyclically rotating field, $H_R$, which rotates in the plane of the magnetic sheet 100, is applied in a manner well known in the art to sequentially magnetize the components on sheet 100 to propagate bubble domains in a controlled manner.

External control electronics 50 is any suitable device which is capable of producing the required conductor control current signals. The control electronics are connected to the chip to selectively produce the respective signals on the respective lines emanating therefrom.

The organization shown in FIG. 1 is multiple channel. In particular, two channels, i.e. channels 1 and N, are shown. However, other channels can be incorporated into the chip organization. If desirable, multiplexing of the channels can be provided along the lines suggested relative to channels 1 and N.

In the example shown in FIG. 1, two channels are shown. The data are organized such that they are evenly distributed between these two channels e.g. with all the odd bits in channel 1 and all the even bits in channel N. In the propagation area, other than the storage registers 18, bubbles propagate in the alternative bit mode or one data bubble every two cycles.

A pair of generator devices identified as generators 10 and 10N are utilized in channels 1 and 2, respectively. The generators are of any suitable structure known in the art such as a disc or a loop generator. Generator 10 is connected to input propagation path 12. Propagation path 12 has a length identified as X + 1, wherein X is related to a number of field cycles of rotating field $H_R$. Path 12 supplies bubbles to multiple output replicator 14 (MOR). Replicator 14, in turn, replicates the bubbles from generator 10 into any desired number of bubbles which are applied to input decoder 16 along suitable propagation paths. Four propagation paths 12A, 12B, 12C and 12D are shown for convenience. The number of propagation paths may be increased or decreased depending upon the number of storage registers 18 in the system. The multiple replication of bubbles, of course, is desirable in that the number of generator devices 10 in a propagation channel is substantially reduced. Ultimately, this reduces the necessity of large quantities of power to nucleate bubbles.

Input decoder 16 includes propagation paths 12A–12D. Input decoder 16 is an annihilator type decoder (as described infra) consisting of decoder lines which control the propagation of bubbles from paths 13A–13D to paths 17A–17D in response to signals A and B from control circuit 50.

Input decoder 16 is also connected to respective storage registers 18, identified as storage registers SA, SB, SC, and SD. Typically, although not so limited, each path 12A–12D of input decoder 16 is connected to a separate storage register 18 by suitable merge 21 or the like. Each of these registers is a closed loop propagation path which may include a plurality of propagation path elements which are well known in the art.

Typically, all of the bubbles supplied to input decoder 16 on paths 13A to 13D (except one selected path) may be collapsed (annihilated). Thus, information contained in the bubbles (e.g. binary information) is written into a selected storage loop. In a preferred application, the bubbles are annihilated completely so that the propagation path can be simplified and no unwanted bubbles are left in the circuit to interfere with the chip operation. Operation of the decoders is described in detail infra.

Switches 20A, 20B, 20C and 20D are connected in series with propagation paths 19A, 19B, 19C and 19D, respectively. Of course, parallel switch arrangements can be utilized. Each switch 20 comprises a replicate transfer switch 20 which is connected to receive an R/T signal from controller 50. The switches selectively transfer or replicate magnetic bubble domains from the respective storage register to the associated propagation paths 19A, 19B, 19C or 19D when energized by the R/T signal. The information on the propagation paths is propagated to output decoder 22.

Output decoder 22 is similar to input decoder 16 in that the bubbles emanating from the storage registers may be collapsed in all but one propagation path. The operation of output decoder 22 is controlled by signals A and B from controller 50. Output decoder 22 comprises a plurality of propagation paths each of which has a length identified as Y wherein Y is related to the number of cycles of rotating field $H_R$. The length Y is also related to the length X noted with respect to input decoder 16. In fact, in many cases X and Y may be equal but this is not a requirement of the system. Typically, the information in only the selected path from a particular storage loop will reach multiple input detector 24 to produce an output signal. Detector 24 may be of any suitable configuration and may include a single detector or a plurality of smaller detectors connected in series.

A suitable output detector device 26 is connected to detector 24 to produce output signals in accordance with the operation of the detector. In a preferred embodiment, detector 24 may be connected as part of the guard rail that surrounds the system in some chip structure configurations.

Channel N is of similar constructon to channel 1 defined above. Thus, generator 10N supplies bubbles to replicator 14N via propagation path 12N. However, in channel 1 propagation path 12N has a length which is identified as X. Consequently, path 12N is one closer to generator 10N than generator 10 is to path 12. For example, the difference may be considered as one field cycle (provided the path structures are the same). In any event, whether through different path structures or lengths, a bubble from generator 10N is supplied to replicator 14N at the same time as the bubble generated by generator 10 in response to the same signal G is supplied to replicator 14. Thus, alternate bit operation is provided at generators 10 and 10N.

Likewise, in channel N, output decoder 22N has a length of Y + 1 as compared to a length Y of decoder 22. Storage loops 18N have the same length as storage loops 18. Consequently, bubbles are supplied to detector 24 from storage loops 18 before bubbles are supplied to detector 24N from storage loops 18N. In point of fact, the relationship between length Y and Y + N as well as length X and X + N is such that the total length from generator to detector of channels 1 and N are equal. Therefore, bubbles from generators 10 through 10N (which are generated at different times) are detected at detectors 24 and 24N at different times. This permits alternate bubble operation to present consecutive bubble information.

In considering the operation of the chip, it is assumed that useful information is to be stored in the various storage registers. In order to store information in the respective storage registers, the fields $H_B$ and $H_R$ are applied and controller 50 is made operative. The generator signals G1 and GN are produced by controller 50 one cycle apart (for example) and applied to generators 10 and 10N which produce magnetic bubble domains as is known in the art. The magnetic bubble domains are propagated along paths 12 and 12N to multiple output replicators 14 and 14N. As noted above, the bubble from generator 10N reaches replicator 14N at the same time as the bubble from generator 10 reaching replicator 14. Replicator 14 produces (replicates) bubbles along propagation paths 13A through 13D. Replicator 14N produces bubbles along propagation paths 13NA through 13ND. In response to signals A and B from control circuit 50, input decoders 16 and 16N are rendered operative to permit bubbles to propagate along one propagation path, for example path 13. A different arrangement of signals A and B will permit the propagation of bubbles to propagation path 13, and so forth. Typically, the signals A and B will cause input decoders 16 and 16N to collapse all bubbles on the other propagation paths. Of course, if desirable, bubbles may be propagated along a plurality of propagation paths.

The bubbles from the selected propagation paths are then stored in the appropriate storage loop 18 or 18N. The information in storage loops 18 and 18N circulates continuously around the loop in response to rotating field $H_B$. It may be considered that loops 18N store odd numbered bits while loop 18 store even numbered bits.

Each storage loop or register 18 has an associated transfer/replicate switch 20. Each switch 20 is connected, in series with the other transfer/replicate switches, to controller 50. Switches 20 are activated by signal R/T whereby all of the information in the respective storage registers 18 may be replicated out of the storage loop and propagated to the output decoder 22. That is, when switches 20 (A–D) and 20N (A–D) are simultaneously pulsed by the application of the R/T signal from control circuit 50, the information in storage loops 18 is transferred to propagation paths 19 (A–D) and 19N (A–D) which form part of output decoder 22. Decoder 22, similar to input decoder 16, receives bubbles on propagation paths 19 (A–D) and 19N (A–D). However, in accordance with the control signals A2 and B2 from control circuit 50, only certain bubbles are permitted to propagate to detectors 24 and 24N wherein the bubble information is detected and displayed at detector output 26. The unselected bubble information is, in a preferred embodiment, annihilated although this operation is not a requirement.

Read-out of information from the storage registers may be accomplished either nondestructively or destructively. In the preferred mode of nondestructive readout (NDRO), switches 20 and 20N operate in the replicate mode and the information from the storage loop is replicated. Thus, information is simultaneously propagated to output decoders 22 and 22N and, as well, returned to the same storage register.

In the destructive readout (DRO) mode of operation, the domains are cleared from the storage registers via switches 20 and 20N which are operated in the transfer mode thereby propagating all bubbles in the storage loops to multiple input detector 24 and 24N. By properly selecting the signals A2 and B2 from controller 50, all of the bubbles are annihilated. The destructive readout can be utilized to effectively clear all storage registers for insertion of additional bubble domain information.

Figure 2:
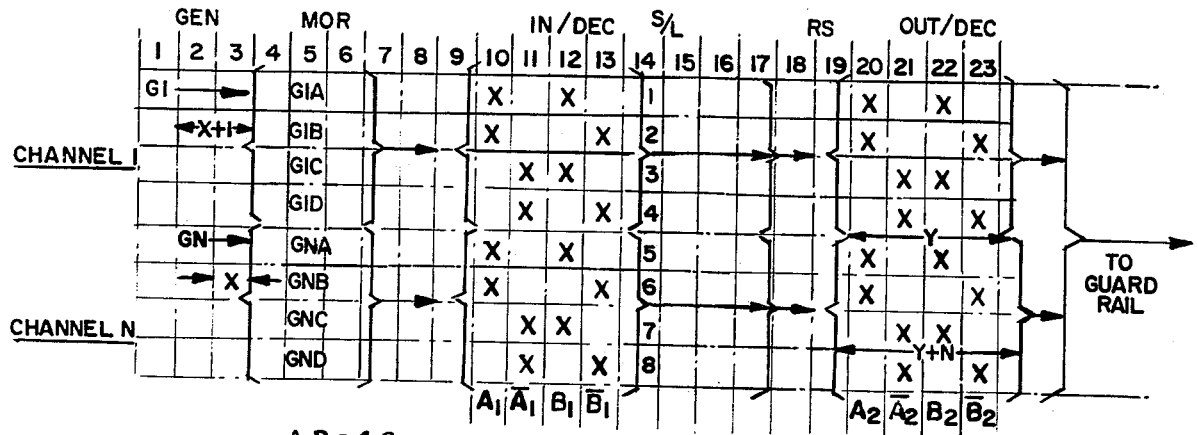
FIG. 2 is a diagram illustrating the functional operation of this invention.

Referring now to FIGS. 1 and 2 concurrently, the functional operation of the instant invention is considered. In particular, a more detailed discussion of annihilator-type input decoder 16 (or output decoder 22) utilized in this invention is presented. These decoder schemes utilize a one-level line-annihilator wherein a permalloy line may directly cross the propagation path comprised of chevron elements connected with a gross aligned conductor overlay. Typically, decoder 16 includes a pair of decoder lines A1 and B1 connected to receive signals from controller 50. The decoder lines are returned to a common conductor (not shown) which is connected to a suitable reference source, for example, ground potential. Decoder line A1 includes annihilators portions located adjacent propagation paths 13A, 13B, 13NA and 13NB. Likewise, decoder line B1 includes annihilator portions located adjacent propagation paths 13C, 13D, 13NC and 13ND. It should be especially noted that decoder lines A1 and B1 are each located adjacent separate columns in propagation paths 13A, 13C, 13B and 13D, respectively. For example, line A1 is disposed adjacent to one column (in this embodiment the second column) in paths 13A and 13B. Also, line A1 is disposed adjacent to another column (in this embodiment the third column) in paths 13C and 13D. Similarly, line B1 is located adjacent one column in paths 13A and 13C and a different column in paths 13B and 13D. This arrangement follows a "binary" type of layout of known configuration. Of course, for additional columns of decoder logic, additional decoder lines will be required. The signal conductors of decoder lines A1 and B1 are formed of suitable conductive material such as copper, aluminum, gold, chromium or alloys thereof, on the magnetic material. Separate annihilator conductors formed of permalloy or the like over (or as part of) the propagation paths can be included with and connected between spaced ends of the decoder line signal conductors. Conversely, decoder lines A1 and B1 can function as the annihilator conductors, per se. The decoder lines are, in this embodiment, disposed adjacent to one end of the chevron group of the adjacent propagation path.

The actual propagation path is determined by activating the desired decoder lines with current pulses from controller 50. Inasmuch as decoders 16 and 22 are substantially similar, the information stored in a storage register is affected in terms of transferring and/or annihilating of selected streams of magnetic bubble domains. Thus, the decoder annihilates unselected bubbles instead of shifting or delaying them thereby eliminating all unselected bubbles from interference with the chip operation.

Because of the two channel multiplexing arrangement, the bubbles propagate in the alternative bit mode. Each set of decoder lines shown in FIG. 1, in essence has a binary effect. For example, if decoder line A1 is activated by controller 50 at every odd cycle (signal $\overline{A1}$), bubbles entering path 13C and 13D continue to propagate through the decoder. However, the bubbles in paths 13A and 13B are annihilated. The annihilation of bubbles entering path 13C and 13D is effected by supplying a current pulse through conductor A1 at every even cycle (signal A1). The The current polarity through the conductor is selected to generate a negative magnetic field at the annihilator position which collapses the stripe domain. Likewise, application of signal B1 to line B1 annihilates bubbles at paths 13A and 13C. Also, application of signal B1 to line B1 by controller 50 annihilates bubbles at paths 13B and 13D. Other lines and paths can be added to the system to perform additional functions. It can be seen that sets of decoder lines can be utilized to achieve a binary function of an input decoder thereby transferring the desired information in the respective propagation path of the selected storage register. The unselected bubbles are neither steered nor repelled but are annihilated so that unselected bubbles may not contaminate the propagation paths.

In this embodiment, controller 50 is indicated to have the ability to produce signals which are unipolar. Thus, signal A1 represents, for example, a positive pulse (such as a current pulse) from controller 50 to the common conductor at a given time e.g. every odd cycle. Conversely, the signal $\overline{A1}$ represents a similar polarity signal, or current pulse, at a different time, e.g. every even cycles. Likewise, different phase signals B1 and $\overline{B1}$ can be generated in conductor 96.

It is to be understood that a desired change in the coding of the signals applied to any of the described decoders can result in information being stored in any storage register. While the previously filled storage register will remain unaffected during this operation, this operation continues until the storage registers are filled with the desired information. Depending upon the design, the number of sets of annihilating lines will vary.

The operation of the circuit shown in FIG. 1 and described above is best summarized by referring to FIG. 2. Thus, referring to FIG. 2, signals are applied to channels 1 and N as indicated. For example, signal G1 is generated by controller 50 and supplied to generator 10 to produce a signal during time period 1. During time period 2, signal N is supplied by controller 50 to generator 10N to produce another output bubble. However, it should be noted that at time period 2, the bubble produced by generator G1 has propagated through propagation path 12 a distance equivalent to one field cycle. Consequently, the bubbles produced by generators 10 and 10N (represented by signals G1 and GN in FIG. 2) are both the same relative distance from the generators at time period 2.

During time period 3, the bubbles are propagating through paths 12 and 12N respectively. Each of the bubbles is then received at replicator 14 or 14N, respectively, at time period 4. Multiple output replicators 14 and 14N produce multiple output bubbles during time periods 5 and 6, which operation is merely representational. Thus, bubbles G1A through G1D are produced by replicator 14N. The bubbles then propagate through a suitable propagation path (see the first chevron row in paths 13A through 13D in FIG. 1). This propagation is represented as occurring during time periods 7, 8 and 9. Of course, additional time periods (or conversely fewer time periods) can be utilized. Thus, the signals are supplied to input decoders 16 and 16N at time period 10. It should be understood, that input decoders 16 and 16N each receive four input bubbles at time period 10. The input decoders are then activated by the signals supplied by controller 50 to determine which of the bubbles are propagated into the storage loops.

The pattern illustrated in FIG. 2, relative to the input decoders, indicates with an X those positions at which annihilation of bubbles occurs in response to the applied signal. For example, bubbles G1A and G1B, GNA and GNB are all annihilated during time period 10 by the application of signal A1. On the other hand, bubbles G1C, G1D, GNC and GND are all annihilated during time period 11 by the application of signal A1. Basically this represents the fact that a signal is applied along line A1 either during time period 10 or 11. In addition, as bubbles propagate through the paths 13A through 13D and 13NA through 13ND, they are located in the second column (in this illustration) of chevrons adjacent to conductor A1 during time period 10. During time period 11, the bubbles will have propagated through the same propagation paths to a third column of chevrons and again adjacent to other portions of conductor A1. Consequently, the timing of the application of the signal to conductor A1 is determinative of which bubbles are annihilated.

Obviously, similar discussions pertain to signals B1 and $\overline{B1}$ which are applied during time periods 12 and 13. These signals affect the bubbles propagating through propagation paths 13 as well. During time period 14, the selected (i.e. not annihilated) bubble is applied to the appropriate storage register 18. For example, if bubbles are to be applied to various storage loop SB and SNB (the second and sixth storage loops in the described embodiment) the signals $\overline{A1}$ and B1 will be applied by controller 50. That is, the signal $\overline{A1}$ will annihilate the bubbles G1C and G1D as well as GNC and GND. Also, signal B1 will annihilate bubbles G1A and GNA. By not applying signals A1 and $\overline{B1}$ the bubbles G1B and GNB are not affected.

After the bubbles have been stored in the storage loops, bubbles are generated from storage loops via the replicate switch during time period 15. Again, the information which is to be submitted to the detector is controlled by output decoders 22 and 22N. That is, each of the replicate transfer switches 20A and so forth, are activated by the application of the replicate/transfer signal R/T. Consequently, an output bubble is produced from each of the storage loops. Of course, this presupposes that information has been stored in all of the loops previously.

Nevertheless, signals A2, $\overline{A2}$, B2 and $\overline{B2}$ are applied in accordance with the procedures previously discussed by controller 50. The signals thus control which output signals are propagated from the storage loops through to multiple input detectors 24 and 24N and, thence, to output detector 26. The operation of decoders 22 and 22N is substantially similar to the operation of input decoders 16 and 16N and is not described in further detail.

Figure 3:
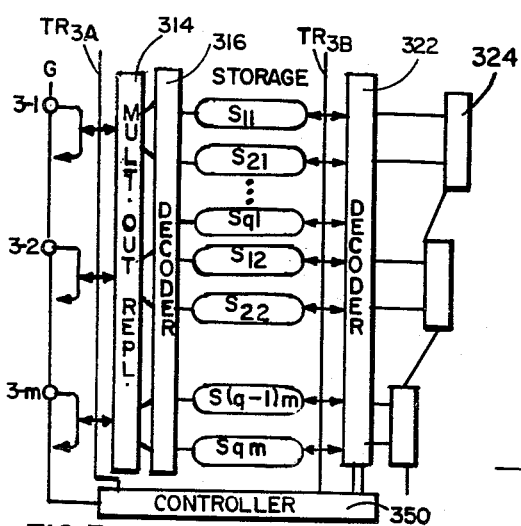
FIG. 3 is a generalized showing of the chip organization shown in FIG. 1.

Referring now to FIG. 3, there is shown a more generalized embodiment of the invention. In this embodiment, the chip is divided into M identical channels. Each channel has Q storage registers and is organized in any suitable decoder organization, such as the one shown in FIG. 1 or any equivalent organization described in the noted references. The decoder networks in each channel are exactly identical and are all controlled by the same decoder lines. Therefore, when the proper decoder code is applied to the decoder network, one storage register in each channel is selected and accesses to the Input or Output port, (i.e. generator or detector). With M parallel channels, M storage registers are selected by the decoder code and M blocks of data are stored in these M registers in a fashion described in detail infra.

To illustrate the operation of the organization, the generator-replicator-decoder combination shown in FIG. 3 is used as a specific example. In this embodiment, a somewhat different generator arrangement is provided. That is, a single generator line G3 is connected to controller 350. The suitable generator signal is applied along this line. The generator signal G3 on line G3 is applied to generators 3-1, 3-2 and 3-M. Each of the generators therefore reduces a magnetic bubble at the same time. In addition, each of the individual generators is associated with a respective propagation path 312. The propagation path may be connected or arranged so that bubbles propagate therealong in response to the rotating magnetic field and are ultimately annihilated at the end of the propagation path. A suitable transfer switch TR3A is associated with each of the propagation paths 312. A signal TR3A is applied along the switch line TR3A to activate the transfer replicate switches. These switches are arranged so that each switch is associated with a progressively different location in propagation path 312. Thus, the distance between generator 3-1 and first transfer switch TR3A is a prescribed distance which, for example, is designated as X. The distance between generator 3-2 and the associated transfer switch is designated as the distance X + 1. Likewise, the distsnce between switch 3-M and the associated transfer switch is designated X + M. Of course, the distance can be reversed such that generator 3-M is located closer to the associated transfer switch relative to generator 3-1.

Multiple output replicator 314 is arranged to receive bubbles from transfer switch TR3A and to provide a prescribed plurality of replications of the supplied signals to decoder 316. Decoder 316 can be of any suitable configuration such as those described supra.

A plurality of storage loops 318 are connected to receive outputs from decoder 316. As is well known, depending upon the operation of decoder 316, certain selected information is supplied to prescribed storage loops for storage there. A further transfer replicate switch TR3B transfers or replicates information in the storage loops to output decoder 322. Output decoder 322, in response to signals supplied by controller 350, selectively passes information i.e. bubbles therethrough to detector 324. Detector 324 may comprise a plurality of sections which are connected in series. The sections are shown to be disposed at different distances from decoder 322. This difference in distance is the compliment of the distance between the generator and the associated transfer switch at the front end of the channel. Thus, throughput integrity is maintained.

Figure 4:
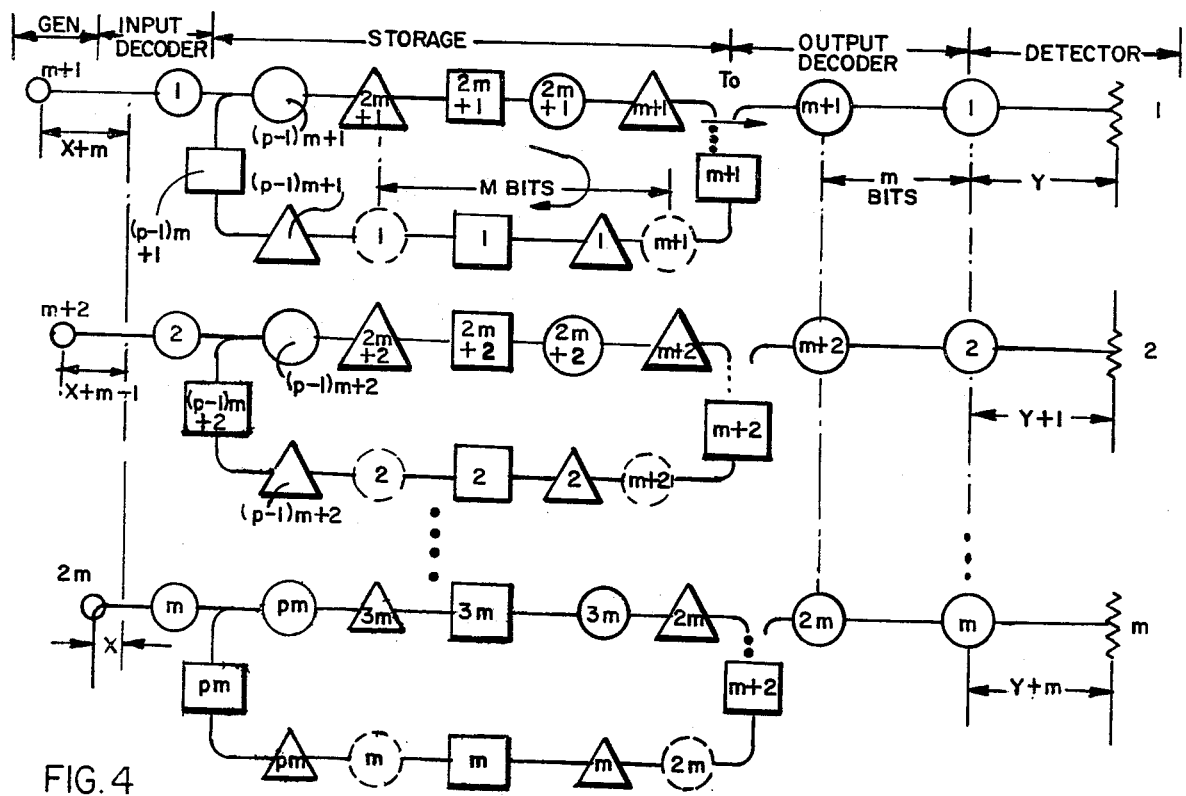
FIG. 4 is a schematic representation of storage loops used in the embodiments shown in FIGS. 1 and 3.

Referring now to FIG. 4, there is shown a schematic representation of the storage loops in the respective channels of either of the embodiments described supra. This diagram shows the data flow sequence in M corresponding loops which represent the M storage loops shown in either of the above embodiments.

As described supra, the generators are spaced from the mobile input replicator and/or the input decoder by progressively differing distances. The difference in distance is complimented by establishing a different distance between the output decoder and the detector wherein throughput signal integrity is maintained. In each of the loops shown in FIG. 4, there are M different blocks of information represented. Each of the blocks is represented by a different symbol. For example, one block of information is represented by a circle, one block by a square and one block by a triangle. In the illustration, the circle represents the first block, the square the second block and the triangle the Mth block. Furthermore, each of the blocks has pm bits of information and are evenly distributed among these M registers. The bit sequence is 1, 2 ... M, M + 1, M + 2 ... 2M ..., $(p - 1)n$. Bits 1, M + 1, 2M + 1 ... $(p-1)M+1$ are stored in the first channel, bits 2, M + 2, 2M + 2 ..., $(p - 1)M + 2$, are stored in the second channel, and so on and so forth.

If, now, one of the M blocks of information is selected fro readout, transfer switch TD (equivalent to TR3B or the like) is activated. This switch operates to transfer to the output decoder network the information which is presented when the transfer switch is activated. Thus, in the example shown, bit 1 in the solid circle has been transferred from storage loop S11 to the output decoder via swtich TD. The space which was previously occupied by bit 1 is now represented by bit 1 in a dashed circle outline. Likewise, all of the counterpart bits in the specified block of infurmation are transferred at the same time. Consequently, bit 2 in a circle is shown in the detector while the space previously occupied thereby, i.e. bit 2 in a dashed circle, is shown. In addition, to indicate that all of the bits from a prescribed data block are retrieved, bits M + 1 and M + 2 in a circle are shown in the output decoder path while the original spaces for this material are shown as M + 1 and M + 2 in dashed circles. As represented in FIG. 4, the bits in the output decoder are M bits apart. In addition, the specific detector sections are spaced from the decoder by progressively increasing distances wherein bit 1 is detected first, bit 2 second and so forth through to bit M whereupon the cycle is repeated and bit M + 1, then M + 2 through bit 2M are detected and so forth. In addition, by properly synchronizing the operation of the generator input decoder and the like a new block of information including bits 1 through M as shown in the shaded circles is inserted into the space represented by the dashed circles. Consequently, information can be removed from the storage loops during a readout process. New information can then be interleaved into the locations in the storage loops so that large amounts of information can be continuously operated upon. It should be understood, of course, that each of the loops shown in FIG. 4 represents a single, counterpart, loop in the respective sections in the channels shown in the figures above. Throught the appropriate coding of decoders, a single selected loop in each section or channel is connected to the I/O ports for operation.

Figure 5:
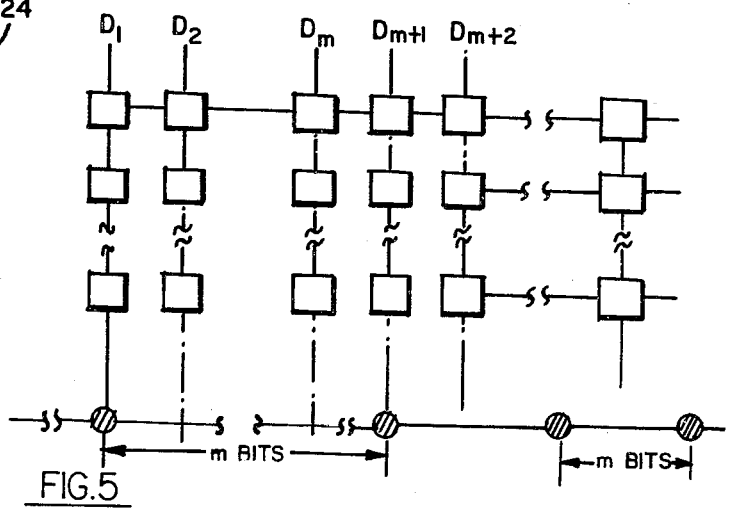
FIG. 5 is a schematic representation of a decoder arrangement.

Referring now to FIG. 5, there is shown a generic representation of any suitable decoder known in the art.

Each of the blocks represents a decoder station in the decoding network. In this arrangement, M decoder lines can share the same lead wherein the complexity of the decoder drive requirements can be reduced. In addition, the number of output leads or conductors is reduced which reduces the complexity of the decoder design. In this embodiment, the decoding stations distinguish through different pulse timing. Thus, at time T = 1, M + 1 and so forth decoder lines D1, DM + 1 and the like are activated. Thus, any bubbles which are at this decoder station are annihilated, transferred or retarded depending upon the decoder arrangement. Conversely, if line D1 is pulsed at a time when the bubble is not at the station shown, the decoder has no effect on the bubble.

Figure 6:
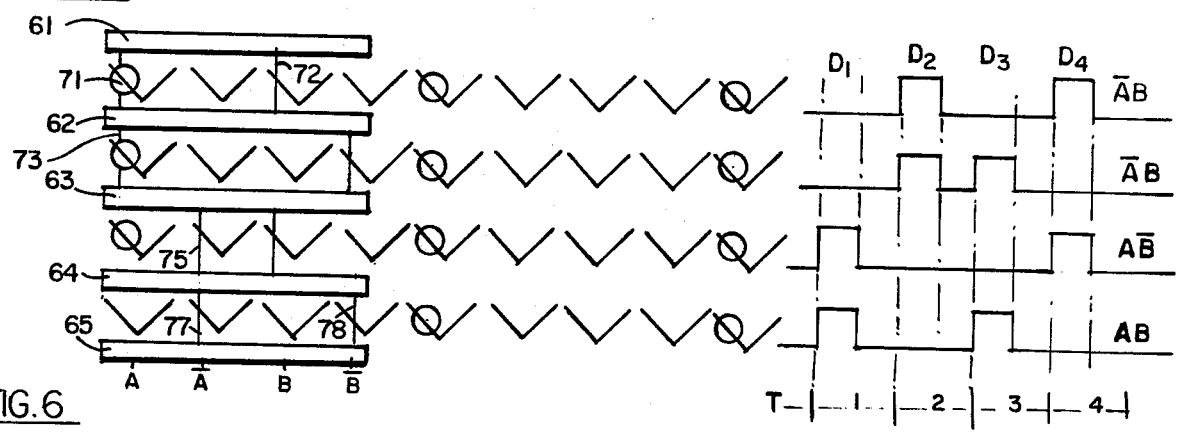
FIG. 6 is a schematic representation of a suitable embodiment of a decoder arrangement.

Referring now to FIG. 6, there is shown a schematic representation of a detector constructed in accordance with the principles outlined supra. For example, a plurality of channels 1, 2, 3 and 4 are presented. Each of these channels is represented by a propagation path comprising a plurality of chevrons along which magnetic bubbles are propagated. The decoder includes a plurality of relatively wide conductor bars 61 through 65. A plurality of relatively narrow conductors are connected between the bar connectors 61 through 65. The narrow conductors 71 through 78 operate as annihilating conductors as described in FIG. 1. With the arrangement shown in FIG. 6, a single pulse is applied to bar 65. The pulse is propagated through to bars 64, 63, 62 and 61 via respective narrow conductors 71 through 78 as shown. Depending upon the timing of the application of the signal, the A, $\overline{A}$, B and $\overline{B}$ effect is produced. That is, a single pulse will, for example, annihilate, the bubble on rows 1 and 2 if applied at time period T1. However, bubbles in columns 3 and 4 in the A position will not be affected. Conversely, bubbles in rows 3 and 4 at the $\overline{A}$ position will be affected by the application of a pulse at conductor 65 during the T2 time slot. The operation of the decoder shown in FIG. 6 as a function of the time of the other signals is believed to be relatively clear.

Thus, there is shown and described a preferred embodiment of multiplexed on-chip decoding circuit organization. In this organization, the decoder network required for the on-chip decoder organization can be simplified through various degrees of multiplexing. For a chip with N registers, if multiplexing of M is used, the number of registers to be decoded through decoders within each channel is then N/M instead of N in the convertial decoder chip. Thus, the required decoder functions can be reduced from $2\log_2 N$ to $2\log_2 N/M$. With multiplexing of M channels, bubbles in the decoder network are propagating M periods apart. This arrangement enables a sharing of decoder leads through different activating timing. Therefore, the number of decoder leads can be further reduced up to a factor of M. For example, if $N = 1024 = 2^{10}$ and M equal to 4. In the prior art, the number of decoder leads required is 20, in the present invention, it is possible to reduce down to 4 ($1/M \cdot 2\log_2 N/M = \frac{1}{4} \times 2 \times \log_2^{1024}/4 = 4$). Any interchangeable devices, components or elements or decoder organizations, may be utilized in this organization without departing from the invention concept. Thus, this scheme is not dependent upon specific components, elements or device organization. Moreover, it may be understood that this chip organization can be achieved with so-called two-level, one and one half level or even one level processing with appropriate choice of components and configuration. This description is intended to be illustrative only and not limitative. The scope of this invention is intended to be limited only by the claims appended hereto.

Having thus discussed a preferred embodiment of the invention, what is claimed is:

1. A device for magnetic bubble domains comprising:
 a plurality of bubble domain generator means;
 a plurality of replicator means for splitting bubble domains from an associated one of said generator means into a plurality of new domains;
 propagation paths of different lengths interposed between each of said generator means and the associated replicator means;
 storage means for storing said bubble domains;
 input decoder means for selectively transferring said bubble domains from said replicator means to said storage register means;
 detector means for detecting said domains having portions thereof at different distances from said storage means;
 switch means associated with said storage means for selectively transferring said domains between said storage means and said detector means; and
 output decoder means for selectively transferring said domains to said detector means.

2. The device recited in claim 1 wherein said storage means comprising a propagation path loop for recirculating domains.

3. The device recited in claim 1 including a magnetic sheet having propagation paths in which said domains can be propagated; and
 means for applying magnetic field thereto to support and move said magnetic bubble domains.

4. The device recited in claim 1 wherein storage means comprises a plurality of separate storage loops, and
 said switch means comprises a plurality of switches connected in series for simultaneous operation,
 each of said switches associated with a separate respective storage loop.

5. The device recited in claim 1 wherein said input decoder means includes at least one conductor crossing said propagation paths, said conductor including at least one portion thereof adapted to apply a magnetic field to selectively annihilate magnetic bubble domain at said path.

6. The device recited in claim 1 including control means for supplying control signals to each of the recited components in order to selectively activate same.

* * * * *